United States Patent [19]

Stewart et al.

[11] Patent Number: 4,760,557

[45] Date of Patent: Jul. 26, 1988

[54] RADIATION HARD MEMORY CELL CIRCUIT WITH HIGH INVERTER IMPEDANCE RATIO

[75] Inventors: Roger G. Stewart, Hillsborough Township, Somerset County; Dora Plus, South Bound Brook, both of N.J.

[73] Assignee: General Electric Company, Schenectady, N.Y.

[21] Appl. No.: 904,156

[22] Filed: Sep. 5, 1986

[51] Int. Cl.[4] .................. G11C 5/02; G11C 11/34; G11C 11/40

[52] U.S. Cl. .................................. 365/154; 365/156; 365/190; 307/279

[58] Field of Search .................. 365/154, 156, 190; 307/279

[56] References Cited

U.S. PATENT DOCUMENTS

| | | | |
|---|---|---|---|
| 3,493,786 | 2/1970 | Ahrons et al. | 307/279 |
| 3,656,010 | 4/1972 | Huyben et al. | 307/279 |
| 3,990,056 | 11/1976 | Luisi et al. | 340/173 R |
| 4,063,225 | 12/1977 | Stewart | 365/156 |
| 4,130,892 | 12/1978 | Gunckel, II et al. | 365/154 |
| 4,149,268 | 4/1979 | Waters | 365/95 |
| 4,590,508 | 5/1986 | Hirakawa et al. | 365/154 |

OTHER PUBLICATIONS

Herbert et al. "SOS Test Structures for Measurement of Photocurrent Sources and Upset Dose Rates in Memories", DNA/Aerospace Corp. Workshop on Test Structures for Radiation Hardening and Hardness Assurance, Feb. 19, 1986.
State Retention RAM by Allen et al. RCA publication from Abstracts for the Space Electronics Conference of Sep. 1986.

*Primary Examiner*—Stuart N. Hecker
*Assistant Examiner*—Alyssa H. Bowler
*Attorney, Agent, or Firm*—Henry I. Steckler; Paul R. Webb, II; James C. Davis, Jr.

[57] ABSTRACT

A memory cell circuit has a pair of cross-coupled inverters. One inverter has an output impedance at least 10 times, preferably, at least 50 times, that of the other inverter so that during a radiation pulse the chance of a change in logic state is reduced. In a particular embodiment, the one inverter has an output impedance of 135 times that of the other inverter.

5 Claims, 2 Drawing Sheets

4,760,557

RADIATION HARD MEMORY CELL CIRCUIT WITH HIGH INVERTER IMPEDANCE RATIO

The Government has rights in this invention pursuant to Subcontract No. A6ZV-700000-E-507 under Contract No. F04704-84-C-0061 awarded by the Department of the Air Force.

BACKGROUND OF THE INVENTION

The present invention relates to a memory cell circuit for use in a random access memory (RAM), and more particularly, to such a cell circuit that is radiation hard.

A typical RAM memory cell circuit comprises two cross-coupled inverters, with each inverter comprising a pair of series coupled metal oxide semiconductor (MOS) transistors. Each pair has a series connected P-conductivity type channel (PMOS) transistor and a N-conductivity type channel (NMOS) transistor.

When the entire circuit is subject to transient radiation and has bias voltages applied, electron-hole pairs are generated in all the component materials, and a photocurrent flows between the circuit devices through the normally insulating layers and insulating substrates. In particular, it is recognized that the dominant failure mechanism of silicon-on-insulator (SOI) devices under transient radiation is photoconduction between silicon devices through the insulating substrate, e.g., sapphire. This effect can cause the charging or discharging of certain critical nodes such as gate electrodes of inverters thereby causing a change in logic state of the memory cell.

It is known from U.S. Pat. No. 4,063,225 to use a memory cell circuit having inverters with different output impedances to prevent WRITE during READ. However, such a circuit has been found to be not completely effective to prevent a change in logic state when the entire circuit is exposed to a high level of transient gamma or X-ray radiation.

It is therefore desirable to provide a memory cell circuit that enhances the stability of the latched logic state and resists a change in logic state even when the entire cell is subject to high intensity radiation.

SUMMARY OF THE INVENTION

A memory cell in accordance with the invention comprises first and second cross-coupled inverters, each inverter having first and second MOS series coupled transistors, each of these transistors having a pair of conduction electrodes and a gate electrode, an access transistor coupled to a conduction electrode of each of the first inverter transistors and the gate electrodes of the second inverter transistors, the second inverter having an output impedance at least 10 times greater than the output impedance of the first inverter.

BRIEF DESCRIPTION OF THE DRAWING

Corresponding reference numerals are applied to corresponding elements in the FIGURES.

DETAILED DESCRIPTION OF THE PREFERRED EMBODIMENTS

Figure 1:
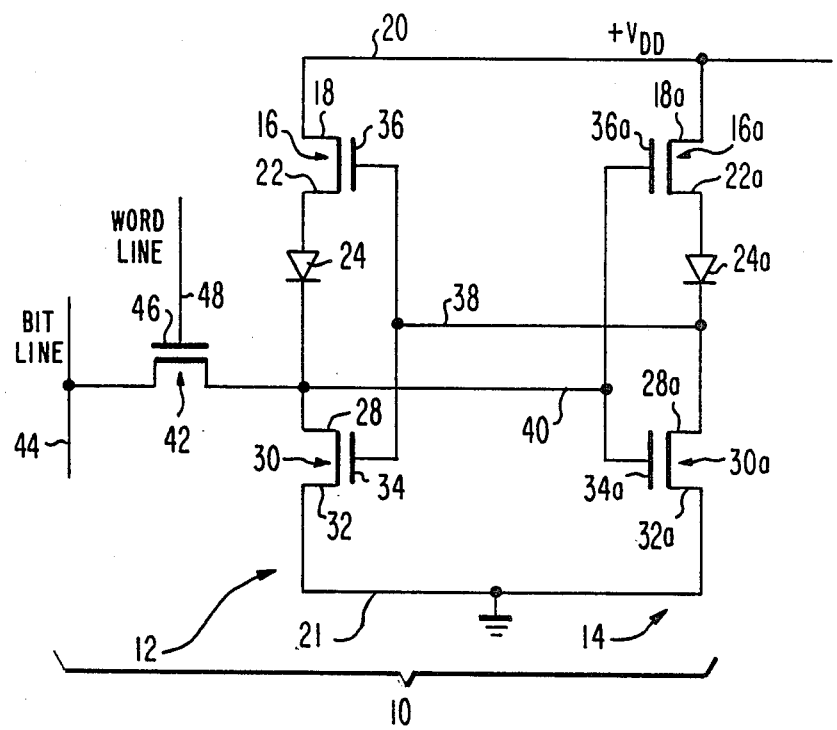
FIG. 1 is a schematic circuit diagram of a memory cell of the invention.

FIG. 1 shows a memory cell 10 comprising first and second cross-coupled inverters 12 and 14, respectively. In inverter 12, PMOS enhancement mode first transistor 16 has a conduction electrode or source 18 coupled to rail 20 to which a positive supply voltage, $V_{DD}$, typically between about 5 and 15 volts, is applied. A conduction electrode or drain 22 of transistor 16 is coupled to an anode of a diode 24. The cathode of the diode 24 is coupled to a conduction electrode or drain 28 of an NMOS enhancement-mode second transistor 30. The transistor 30 has a conduction electrode or source 32 that is coupled to a rail 21, which is grounded, and a gate electrode 34 that is coupled to a gate electrode 36 of the transistor 16.

The second inverter 14 shown in the right hand portion of FIG. 1, is similar to that of the first inverter 12. Corresponding reference numerals have been used on corresponding circuit elements with the suffix "a" added. However, the output impedance on a line 38 of the inverter 14 is more than about ten times larger than the output impedance on a line 40 of the inverter 12. Further, the parasitic distributed capacitance of the gates 34a and 36a is made large relative to that of the gates 34 and 36.

The gates 34 and 36 are connected to the junction of the cathode of the diode 24a and the drain 28a of transistor 30a by the line 38; the gates 34a and 36a are connected to the junction of the cathode of the diode 24 and the drain 28 by the line 40. An MOS access transistor 42 has a conduction electrode connected to the cathode of the diode 24 and the drain 28; another conduction electrode of the transistor 42 is connected to a bit line 44, and a gate 46 is connected to a word line 48.

A precharge voltage of $V_{DD}/2$ is applied to the bit line 44 to initiate operation of the cell 10. To WRITE a ZERO into the cell 10, the access transistor 42 is turned ON by setting the voltage on the word line 48 greater than $V_{DD}$. Further, a data line (not shown) coupled to the bit line 44 then reduces the bit line voltage towards zero volts. The voltage at the gates 34a and 36a is now equal to zero. Hence, the transistor 30a is OFF, and the transistor 16a is ON. Thus the voltage at the gates 34 and 36 is equal to $V_{DD}$, thereby making the transistor 30 ON, and the transistor 16 OFF.

To WRITE a ONE into the cell 10, the access transistor 42 is turned ON as described above, and the data line directly applies the voltage $V_{DD}$ to the bit line 44. The voltage at the gates 34a and 36a is now equal to $V_{DD}$. The transistor 16a is now OFF, and the transistor 30a is now ON. Thus the voltage at the gates 34 and 36 is zero volts, thereby making transistor 16 ON and the transistor 30 OFF.

To READ the cell 10 the transistor 42 is turned ON by setting the word line 48 to $V_{DD}$. If the cell 10 is storing a ZERO, then the voltage on the line 44 drops from $V_{DD}/2$ towards zero volts. If the cell 10 is storing a ONE, the voltage on the line 44 may rise from $V_{DD}/2$ towards $V_{DD}$. A sense amplifier (not shown) that has an input coupled to the bit line 44 senses this voltage change or no change.

In the presence of transient gamma or X-ray radiation, electron-hole pairs are generated in all cell materials. These pairs then disassociate in the presence of an electric field causing a surge current that lowers the voltage on the rail 20 and raises the voltage on the rail 21 (called "power rail collapse"). The changes in the rail voltages are coupled through the ON transistor 16a or 30a (cell 10 storing a ZERO or a ONE, respectively) to the drain 22a or 28a thereof, respectively, and then through the large parasitic drain-to-gate (input) capacitance to the gate 36a or 34a, respectively. This drives the ON transistor 16a or 30a further ON and thus tends to strengthen the latched logic state of the cell 10.

Further, the diodes 24 and 24a provide a buffering voltage drop of at least 0.6 volts and, together with the high output impedance and high input capacitance of the inverter 14, significantly reduces the toggling sensitivity of the cell 10 during radiation transients.

A "sudden event upset" (SEU) is defined as a change in the logic state of the cell 10 due to radiation of particles such as heavy metals and alpha particles. Typically such particles produce a photocurrent pulse of about 0.2 nanoseconds (ns) as compared to photocurrent pulses between about 5 and 50 ns produced by nuclear radiation. It has been found that the resistance of the diodes 24 and 24a during such a short duration current transient is sufficiently high that a voltage drop of about 2 to 4 volts occurs thereacross instead of the more typical voltage drop of 0.6 volts during steady state operation or longer duration radiation pulses. This drop helps prevent the occurrence of an SEU by buffering the radiation induced voltage change on the drains 22 or 22a from the gates 34a and 36a or 34 and 36, respectively.

Figure 3:
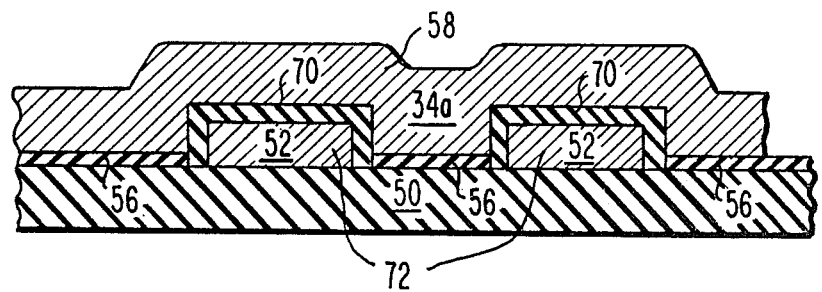
FIG. 3 is a cross-section of the IC taken along the line 3—3' of FIG. 2.
Figure 2:
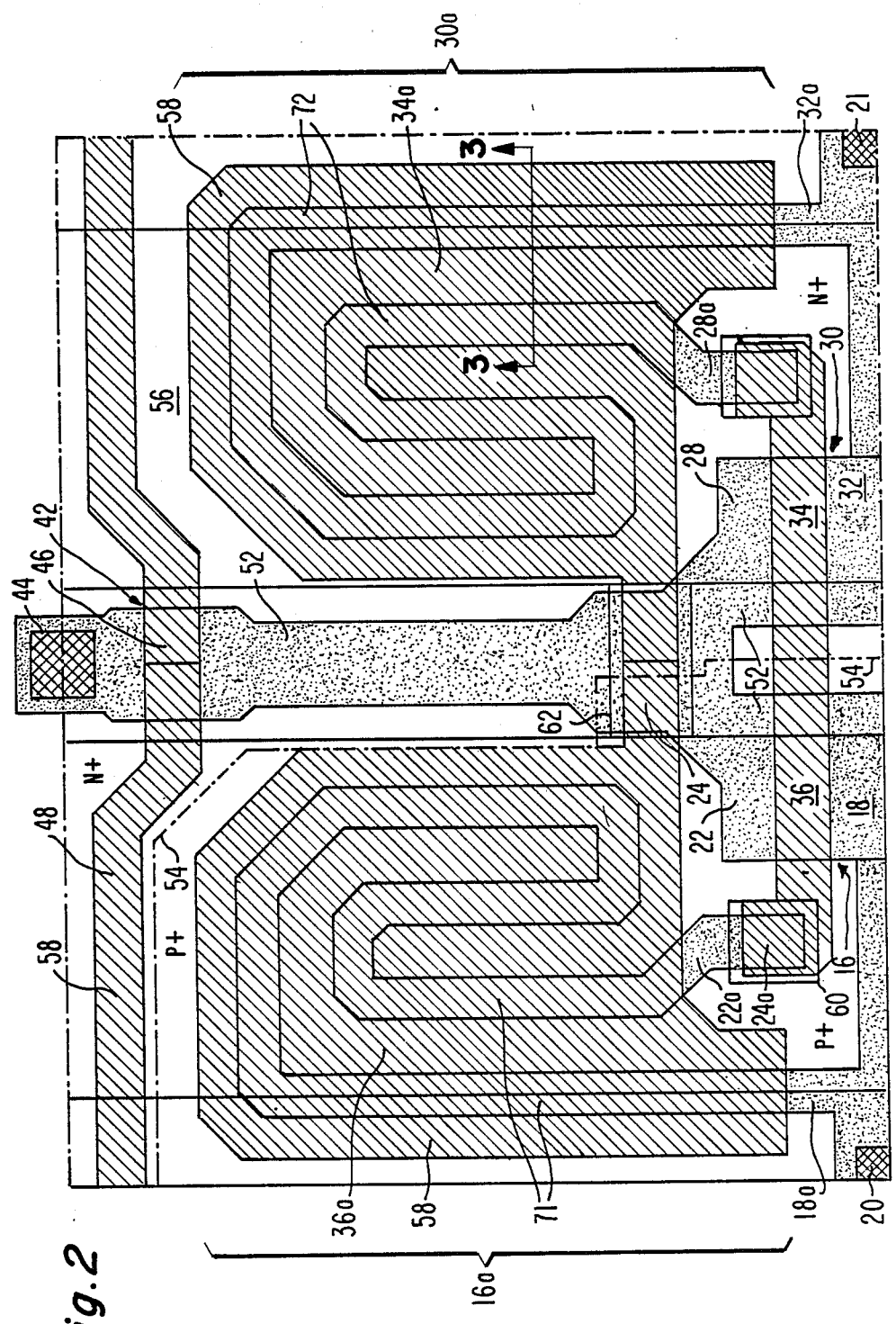
FIG. 2 is a top view of an integrated circuit (IC) embodiment of the circuit of FIG. 1.

Referring now to FIGS. 2 and 3, the structure of an embodiment of the circuit of FIG. 1 comprises an insulating body or substrate 50 having disposed thereon an overlying conducting layer 52 indicated in FIG. 2 as a dotted area. A dot-dash line 54 in FIG. 2 is the border between those areas that are doped P+ and N+. In the layer 52 P−N junctions exist at the border 54. The channel regions are undoped.

Also formed in the layer 52 are the sources and drains of the transistors 16, 16a, 30, 30a and 42 and as well as the folded or serpentine-shaped channel regions 71 and 72 of the transistors 16a and 30a, respectively. That part of the channel regions that are adjacent the sources at least partially shield the drains and the channel regions near the drains from photocurrent collection. The channel regions 71 and 72 should be in the shape of concentric spirals to achieve maximum shielding. However that would require conductors at the centers of the spirals to make connection thereto, which conductors would collect photocurrents. In the transistors 16a and 30a, the central portions of the channel regions 71 and 72, respectively, are resistively isolated from both sources and drains due to their length and intrinsic conductivity; thus photocurrents are shunted to the gates 34a and 36a instead of flowing to the transistor drains 22a and 28a and from there to the sensitive gates 34 and 36 of the inverter 12. The gates 34 and 36 are more sensitive than the gates 34a and 36a since the low impedance of the inverter 12 enables the inverter 12 to change the conduction state of its transistors 16 and 30 faster than does the high impedance state of its transistors 16a and 30a. Due to the extended lengths of channel regions 71 and 72, a high distributed resistance and capacitance is obtained. This provides the abovementioned high output impedance and high gate or input capacitance of the inverter 14 as compared to that of the inverter 12.

In a particular embodiment, the transistor 42 had a device width and length of 6 and 3 micrometers ($\mu$m), respectively; the transistors 16 and 30 had device width and lengths 9 and 3 $\mu$m, respectively, for a ratio of 3; the transistors 16a and 30a had device widths and lengths of 2.25 and 101 $\mu$m, respectively, for a ratio of about 1/45. Thus the impedance ratio of the inverters 14 and 12 is 3 ÷ 1/45 = 135. In general, the desired impedance ratio is at least 10 and, preferably, at least 50, based on the need to make the toggle rate of the cell much slower than the transient event. The impedance of the transistor 42 is made smaller than that of the transistors 16 and 30 to prevent a change of the logic state during a READ operation.

As can be seen in FIG. 2, the layout is symmetrical. In particular, the transistors 16 and 30 have identical device size and so do the transistors 16a and 30a. This results in identical transient photocurrents for symmetrical coupling to the sensitive gates thereof. The drains 22, 28, 22a, and 28a are disposed nearer the center of the cell 10 than the respective sources 18, 32, 18a, 32a, respectively, in order to minimize collecting photocurrents from adjacent cells (not shown).

All of the top surface of the substrate 50 that is not covered by the layer 52 is covered by an electrically insulating barrier layer 56. Overlying the barrier layer 56 is an N+ conductivity type conducting layer 58 indicated in FIG. 2 by diagonal shading. The substrate 50 and the layers 56 and 58 comprise three different materials (described in detail below). It is believed that the energy band differences of the materials as well as their interface conditions help the layer 56 serve as a barrier to charge carrier flow between the layer 52 and the conducting layer 58 through the substrate 50.

In the conducting layer 58 are formed interconnecting conductors such as the word line 48, and the gates 36, 34, 36a, and 34a of each of the transistors 16, 30, 16a and 30a, respectively. Since the channel regions 71 and 72 are serpentine-shaped, the areas of the gates 34a and 36a are reduced to a minimum as compared with a conventional transistor layout wherein the gates normally extend beyond the channel region in the width direction. This minimum area reduces photocurrent collection and photocurrent generation.

In FIG. 2 buried contacts 60 and 62 are where the layers 52 and 58 contact each other, and are the position of the diodes 24a and 24, respectively.

FIG. 3 shows a cross-sectional view of the transistor 30a in the width direction, i.e. perpendicular to the channel region. A channel insulating layer 70 overlies the conducting layer 52 having the channel region 72, and the conducting layer 58 overlies the layer 70. Thus, the layer 58 comprises the gate electrode 34a. The barrier layer 56 is disposed between the conducting layer 58 and the substrate 50 to serve as a barrier to photocurrents from the layer 58 through the substrate 50 to other conductors of the cell 10. In particular, the barrier layer 56 has reduced volume as compared to a thicker layer to minimize the number of electron-hole pairs generated by radiation, and therefore minimize radiation induced photocurrent.

As stated above, the different portions of the conducting layer 58 forms the gates 34 and 36 of the transistors 30 and 16, respectively, and also the gates 34a and 36a of the transistors 30a and 16a, respectively. Since photocurrents between the layer 58 and other circuit nodes are minimized as described above, this arrangement further minimizes the effects that cause a change in the cell 10 logic state. The isolation of the gates from other nodes is important since they are the most sensitive electrodes of the cell structure.

The substrate 50 can comprise an insulator such as sapphire ($Al_2O_3$), a silicon oxide, or spinel. The conducting layer 52 can comprise a semiconductor such as silicon (Si), preferably a single crystal epitaxially grown on the substrate 50 and having a thickness of about 500 nm. The sources and drains typically have doping levels of about $10^{20}$ cm$^{-3}$. The barrier layer 56 can comprise an insulator such as a deposited silicon oxide having a maximum thickness of about 300 nm. If the barrier layer 56 is too thick it will be a less effective barrier to photocurrents. In a particular embodiment a thickness of 100 nm worked well. The layer 56 can also comprise a material that is different from both the layers 52 and 58 and has a wider band gap than the layers 52 and 58. The channel insulating layer 70 can comprise a good quality insulator such as a grown silicon oxide having a thickness of about 50 nm. The conducting layer 58 can comprise a conductor such as deposited polycrystalline silicon (p−Si) having a thickness of about 800 nm. A doping level of about $10^{20}$ cm$^{-3}$ is used for the layer 58. In a particular embodiment a doping level of $10^{18}$ cm$^{-3}$ was used. The bit line 44, and the rails 20 and 21 can also comprise a good conductor such as aluminum.

EXAMPLE

A circuit in accordance with the invention except that it had no barrier layer 56 did not change logic state at a radiation dose rate of $5.4 \times 10^{11}$ rads/sec. With a barrier layer, this rate would be even higher.

COUNTEREXAMPLE

In contradistinction a circuit having nearly equal inverter impedance ratios and without a barrier layer, changed logic state at a radiation dose rate of $1.5 \times 10^{11}$ rads/sec.

It will therefore be appreciated that by using the circuit in accordance with the invention a memory cell is produced that resists a change in state when subject to radiation.

What is claimed is:

1. A memory cell circuit disposed on an insulating substrate, said memory cell comprising:

first, second, third, fourth and fifth metal-insulator-semiconductor transistors, each said transistor having a respective channel induced between respective conduction electrodes thereof in a region of semiconductive material disposed on said insulating substrate, each said transistor having a respective gate electrode overlying at least a portion of said region of semiconductive material and insulated therefrom, said first and third transistors having channels of a first-conductivity type between respective source and drain electrodes of said conduction electrodes, and said second and fourth transistors having channels of a second conductivity type between respective source and drain electrodes of said conduction electrodes, said first and second conductivity types being complementary to each other;

a first rail to which the source electrodes of said first and third transistors connect;

a second rail to which the source electrodes of said second and fourth transistors connect;

means for applying a supply voltage between said first and second rails;

means for connecting said first and second transistors as a first inverter, with an input at the interconnection of their gate electrodes, and with an output to which their drain electrodes have respective connections affording no substantial resistance to drain current flow;

means for connecting said third and fourth transistors as a second inverter, with an input at the interconnection of their gate electrodes, and with an output to which their drain electrodes have respective connections affording no substantial resistance to drain current flow;

a first direction connection without substantial intervening impedance between the output of said first inverter and the input of said second inverter;

a second direct connection without substantial intervening impedance between the output of said second inverter and the input of said first inverter;

means for connecting said fifth transistor as an access transistor, including connection of one of its conduction electrodes to said first direct connection without substantial intervening impedance; and means for providing improved radiation hardness, wherein to cause the output impedance of said second inverter to be at least ten times the output impedance of said first inverter the channels of said third and fourth transistors have length over width ratios substantially larger than the channels of said first and second transistors respectively, and wherein to cause the output to input capacitance of said second inverter to be several times the output to input capacitance of said first inverter the gate electrodes of said third and fourth transistors have areas substantially larger than the gate electrodes of said first and second transistors respectively.

2. A memory cell circuit as set forth in claim 1 wherein the connection of the drain electrode of said first transistor to the output of said first inverter is through a first semiconductor diode poled for forward conduction of the drain current of said first transistor, wherein the connection of the drain electrode of said second transistor to the output of said first inverter is a third direct connection without substantial intervening impedance, wherein the connection of the drain electrode of said third transistor to the output of said second inverter is through a second semiconductor diode poled for forward conduction of the drain current of said third transistor, and wherein the connection of the drain electrode of said fourth transistor to the output of said second inverter is a fourth direct connection without substantial intervening impedance.

3. A memory cell circuit as set forth in claim 2 wherein said fifth transistor has its gate electrode connected to a word line alternately switched to the potential of said first rail or to the potential of said second rail, and has connected to a bit line its conduction electrode other than that connected to said first direct connection without substantial intervening impedance.

4. A memory cell circuit as set forth in claim 1 wherein said fifth transistor has its gate electrode connected to a word line alternately switched to the potential of said first rail or to the potential of said second rail, and has connected to a bit line its connection electrode other than that connected to said first direct connection without substantial intervening impedance.

5. A memory cell circuit as set forth in claim 1 wherein the channels of said third and fourth transistors have lengths substantially longer than said first and second transistors, respectively, and to accommodate their relatively long lengths are folded into respective serpentines under their respective gate electrodes.

* * * * *